(12) United States Patent
Lashmore et al.

(10) Patent No.: US 9,198,232 B2
(45) Date of Patent: Nov. 24, 2015

(54) NANOSTRUCTURE-BASED HEATING DEVICES AND METHODS OF USE

(75) Inventors: David S. Lashmore, Lebanon, NH (US); Cory Timoney, Durham, NH (US)

(73) Assignee: Nanocomp Technologies, Inc., Merrimack, NH (US)

( * ) Notice: Subject to any disclaimer, the term of this patent is extended or adjusted under 35 U.S.C. 154(b) by 879 days.

(21) Appl. No.: 12/437,535

(22) Filed: May 7, 2009

(65) Prior Publication Data

US 2009/0277897 A1    Nov. 12, 2009

Related U.S. Application Data

(60) Provisional application No. 61/051,249, filed on May 7, 2008, provisional application No. 61/163,301, filed on Mar. 25, 2009, provisional application No. 61/166,146, filed on Apr. 2, 2009.

(51) Int. Cl.
| | |
|---|---|
| *H05B 3/14* | (2006.01) |
| *H01B 1/04* | (2006.01) |
| *H05B 3/06* | (2006.01) |
| *H05B 3/34* | (2006.01) |
| *H05B 3/54* | (2006.01) |

(52) U.S. Cl.
CPC ................ *H05B 3/145* (2013.01); *H01B 1/04* (2013.01); *H05B 3/06* (2013.01); *H05B 3/146* (2013.01); *H05B 3/34* (2013.01); *H05B 3/54* (2013.01); *H01L 2924/0002* (2013.01); *H05B 2203/007* (2013.01); *H05B 2214/04* (2013.01)

(58) Field of Classification Search
USPC ......... 219/386, 528, 529, 543, 544, 545, 549, 219/553; 257/4, 414, 661, 662, 664, 739; 977/742; 428/215, 216; 136/201, 205, 136/211
See application file for complete search history.

(56) References Cited

U.S. PATENT DOCUMENTS

| | | | |
|---|---|---|---|
| 3,090,876 | A | 5/1963 | Hutson |
| 3,109,712 | A | 11/1963 | Redfern |

(Continued)

FOREIGN PATENT DOCUMENTS

| | | |
|---|---|---|
| CN | 1614772 | 5/2005 |
| DE | 102006014171 | 9/2007 |

(Continued)

OTHER PUBLICATIONS

Biro, et al., "Direct Synthesis of Multi-Walled and Single-Walled Carbon Nanotubes by Spray-Pyrolysis", J. Optoelectronics and Advanced Materials, Sep. 2003; vol. 5, No. 3, pp. 661-666.

(Continued)

*Primary Examiner* — Thien S Tran
(74) *Attorney, Agent, or Firm* — Greenberg Traurig, LLP; Chinh H. Pham; Todd C. Basile

(57) ABSTRACT

A heating device having a thermally conducting member made from a matrix of carbon nanotubes and having opposing ends. A connector portion can be positioned at each end of the conducting member, and can be capable of receiving a current from an external source to permit the conducting member to generate heat. A coupling mechanism can be included and associated with the connector portion so as to provide the connector portion with substantially uniform contact across a contact surface area with the conducting member. Methods of using the heating device are also disclosed.

21 Claims, 11 Drawing Sheets

(56) References Cited

U.S. PATENT DOCUMENTS

| | | | |
|---|---|---|---|
| 3,462,289 A | 8/1969 | Rohl et al. | |
| 3,706,193 A | 12/1972 | Amato | 57/58.89 |
| 3,943,689 A | 3/1976 | Kunz et al. | 57/34 R |
| 4,384,944 A | 5/1983 | Silver et al. | 204/159.13 |
| 4,468,922 A | 9/1984 | McCrady et al. | 57/402 |
| 4,572,813 A | 2/1986 | Arakawa | 264/29.2 |
| 4,583,247 A | 4/1986 | Fingerhut et al. | |
| 4,987,274 A | 1/1991 | Miller et al. | 174/102 |
| 5,168,004 A | 12/1992 | Daumit et al. | 428/221 |
| 5,428,884 A | 7/1995 | Tsuzuki | 28/290 |
| 5,488,752 A | 2/1996 | Randolph | 15/250.06 |
| 5,648,027 A | 7/1997 | Tajiri et al. | |
| 5,747,161 A | 5/1998 | Iijima | |
| 6,036,774 A | 3/2000 | Lieber et al. | 117/105 |
| 6,043,468 A * | 3/2000 | Toya et al. | 219/544 |
| 6,110,590 A | 8/2000 | Zarkoob et al. | 428/364 |
| 6,143,412 A | 11/2000 | Schueller et al. | |
| 6,265,466 B1 | 7/2001 | Glatkowski et al. | 523/137 |
| 6,308,509 B1 | 10/2001 | Scardino et al. | 57/402 |
| 6,333,016 B1 | 12/2001 | Resasco et al. | 423/447.3 |
| 6,376,971 B1 | 4/2002 | Pelrine et al. | |
| 6,426,134 B1 | 7/2002 | Lavin et al. | |
| 6,452,085 B2 | 9/2002 | Tauchi et al. | |
| 6,495,116 B1 | 12/2002 | Herman | |
| 6,541,744 B2 * | 4/2003 | Von Arx et al. | 219/544 |
| 6,611,039 B2 | 8/2003 | Anthony | |
| 6,630,772 B1 | 10/2003 | Bower et al. | 313/311 |
| 6,682,677 B2 | 1/2004 | Lobovsky et al. | 264/172.11 |
| 6,706,402 B2 | 3/2004 | Rueckes et al. | |
| 6,764,874 B1 | 7/2004 | Zhang et al. | 438/99 |
| 6,784,656 B2 | 8/2004 | Breinlinger | |
| 6,790,426 B1 | 9/2004 | Ohsaki | |
| 6,842,328 B2 | 1/2005 | Schott et al. | |
| 6,908,572 B1 | 6/2005 | Derbyshire et al. | |
| 6,923,946 B2 | 8/2005 | Geohegan et al. | |
| 6,979,709 B2 | 12/2005 | Smalley et al. | |
| 7,045,108 B2 | 5/2006 | Jiang et al. | |
| 7,048,999 B2 | 5/2006 | Smalley et al. | 428/367 |
| 7,052,668 B2 | 5/2006 | Smalley et al. | |
| 7,182,929 B1 | 2/2007 | Singhal et al. | |
| 7,323,157 B2 | 1/2008 | Kinloch et al. | |
| 7,413,474 B2 | 8/2008 | Liu et al. | |
| 7,437,938 B2 | 10/2008 | Chakraborty | |
| 7,491,883 B2 | 2/2009 | Lee et al. | |
| 7,553,472 B2 | 6/2009 | Mouli et al. | |
| 7,615,097 B2 | 11/2009 | McKechnie et al. | |
| 7,615,204 B2 | 11/2009 | Ajayan et al. | |
| 7,727,504 B2 | 6/2010 | Kittrell et al. | |
| 7,745,810 B2 * | 6/2010 | Rueckes et al. | 257/4 |
| 7,750,240 B2 | 7/2010 | Jiang et al. | |
| 7,846,414 B2 | 12/2010 | Harbec et al. | |
| 7,897,248 B2 | 3/2011 | Barrera et al. | |
| 8,017,272 B2 | 9/2011 | Feng et al. | |
| 8,053,113 B2 | 11/2011 | Oh et al. | |
| 8,071,906 B2 | 12/2011 | Smiljanic et al. | |
| 2001/0003576 A1 | 6/2001 | Klett et al. | 423/445 |
| 2002/0004028 A1 | 1/2002 | Margrave et al. | 423/447.3 |
| 2002/0040900 A1 | 4/2002 | Arx et al. | |
| 2002/0113335 A1 | 8/2002 | Lobovsky et al. | 264/184 |
| 2002/0130610 A1 | 9/2002 | Gimzewski et al. | |
| 2002/0136681 A1 | 9/2002 | Smalley et al. | 423/447.2 |
| 2002/0159943 A1 | 10/2002 | Smalley et al. | 423/447.1 |
| 2002/0179564 A1 | 12/2002 | Geobegan et al. | |
| 2003/0036877 A1 | 2/2003 | Schietinger | 702/134 |
| 2003/0104156 A1 | 6/2003 | Osada et al. | |
| 2003/0109619 A1 | 6/2003 | Keller et al. | 524/440 |
| 2003/0122111 A1 | 7/2003 | Glatkowski | |
| 2003/0133865 A1 | 7/2003 | Smalley et al. | |
| 2003/0134916 A1 | 7/2003 | Hrubesh | |
| 2003/0165648 A1 | 9/2003 | Lobovsky et al. | 428/36.9 |
| 2003/0222015 A1 | 12/2003 | Oyama et al. | 210/500.21 |
| 2004/0020681 A1 | 2/2004 | Hjortstam et al. | |
| 2004/0041154 A1 * | 3/2004 | Watanabe et al. | 257/77 |
| 2004/0053780 A1 | 3/2004 | Jiang et al. | 502/182 |
| 2004/0081758 A1 | 4/2004 | Mauthner et al. | |
| 2004/0096389 A1 | 5/2004 | Lobovsky et al. | 423/447.1 |
| 2004/0124772 A1 | 7/2004 | Chen | |
| 2004/0150312 A1 | 8/2004 | McElrath et al. | |
| 2004/0173906 A1 | 9/2004 | Saito et al. | |
| 2004/0177451 A1 | 9/2004 | Poulin et al. | |
| 2004/0240144 A1 | 12/2004 | Schott et al. | |
| 2004/0265212 A1 | 12/2004 | Varadan et al. | |
| 2004/0265489 A1 | 12/2004 | Dubin | |
| 2004/0266065 A1 | 12/2004 | Zhang et al. | |
| 2005/0000559 A1 | 1/2005 | Horio et al. | |
| 2005/0006801 A1 | 1/2005 | Kinloch et al. | 264/5 |
| 2005/0046017 A1 | 3/2005 | Dangelo | 257/720 |
| 2005/0063658 A1 | 3/2005 | Crowley | |
| 2005/0067349 A1 | 3/2005 | Crespi et al. | |
| 2005/0067406 A1 * | 3/2005 | Rajarajan et al. | 219/553 |
| 2005/0074569 A1 | 4/2005 | Lobovsky et al. | 428/36.9 |
| 2005/0087222 A1 | 4/2005 | Muller-Werth | |
| 2005/0087726 A1 | 4/2005 | Anazawa et al. | |
| 2005/0095938 A1 | 5/2005 | Rosenberger et al. | |
| 2005/0104176 A1 | 5/2005 | Lennhoff | 264/465 |
| 2005/0112051 A1 | 5/2005 | Liu et al. | |
| 2005/0170089 A1 | 8/2005 | Lashmore et al. | 427/248.1 |
| 2005/0269726 A1 | 12/2005 | Matabayas, Jr. | |
| 2006/0118158 A1 | 6/2006 | Zhang et al. | |
| 2006/0207643 A1 | 9/2006 | Weaver, Jr. et al. | |
| 2006/0234576 A1 | 10/2006 | Smith et al. | |
| 2006/0252853 A1 | 11/2006 | Ajayan et al. | |
| 2006/0269670 A1 | 11/2006 | Lashmore et al. | 427/249.1 |
| 2006/0272701 A1 | 12/2006 | Ajayan et al. | |
| 2007/0009421 A1 | 1/2007 | Kittrell et al. | |
| 2007/0029291 A1 | 2/2007 | Boulos et al. | |
| 2007/0036709 A1 | 2/2007 | Lashmore et al. | |
| 2007/0048211 A1 | 3/2007 | Jiang et al. | |
| 2007/0056855 A1 | 3/2007 | Lo et al. | |
| 2007/0087121 A1 | 4/2007 | Chang et al. | |
| 2007/0116627 A1 | 5/2007 | Collier et al. | |
| 2007/0140947 A1 | 6/2007 | Schneider et al. | |
| 2007/0151744 A1 | 7/2007 | Chen | 174/110 |
| 2007/0202403 A1 * | 8/2007 | Oh et al. | 429/217 |
| 2007/0232699 A1 | 10/2007 | Russell et al. | |
| 2007/0236325 A1 * | 10/2007 | Bertin et al. | 338/195 |
| 2007/0237959 A1 | 10/2007 | Lemaire | 428/408 |
| 2007/0277866 A1 | 12/2007 | Sander et al. | |
| 2007/0293086 A1 | 12/2007 | Liu et al. | |
| 2008/0166563 A1 * | 7/2008 | Brittingham et al. | 428/411.1 |
| 2008/0170982 A1 | 7/2008 | Zhang et al. | |
| 2008/0192014 A1 | 8/2008 | Kent et al. | |
| 2008/0238882 A1 | 10/2008 | Sivarajan et al. | |
| 2008/0254675 A1 | 10/2008 | Lee et al. | |
| 2008/0261116 A1 | 10/2008 | Burton et al. | |
| 2009/0042455 A1 | 2/2009 | Mann et al. | |
| 2009/0044848 A1 | 2/2009 | Lashmore et al. | |
| 2009/0047513 A1 | 2/2009 | Lashmore | |
| 2009/0087640 A1 | 4/2009 | Li et al. | |
| 2009/0117025 A1 | 5/2009 | Lashmore et al. | |
| 2009/0169819 A1 | 7/2009 | Drzaic et al. | |
| 2009/0194525 A1 | 8/2009 | Lee et al. | |
| 2009/0237886 A1 | 9/2009 | Iwai et al. | |
| 2009/0255706 A1 | 10/2009 | Jiang et al. | |
| 2009/0266477 A1 | 10/2009 | Weisenberger | |
| 2009/0269511 A1 | 10/2009 | Zhamu et al. | |
| 2009/0277489 A1 | 11/2009 | Dannoux et al. | |
| 2009/0277897 A1 | 11/2009 | Lashmore et al. | |
| 2009/0311166 A1 | 12/2009 | Hart et al. | |
| 2009/0317710 A1 | 12/2009 | Douglas et al. | |
| 2010/0000754 A1 | 1/2010 | Mann et al. | |
| 2010/0021682 A1 | 1/2010 | Liang et al. | |
| 2010/0041297 A1 | 2/2010 | Jiang et al. | |
| 2010/0196249 A1 | 8/2010 | Hata et al. | |
| 2010/0219383 A1 | 9/2010 | Eklund | |
| 2010/0220074 A1 | 9/2010 | Irvin, Jr. et al. | |
| 2010/0243227 A1 | 9/2010 | Wu et al. | |
| 2010/0243295 A1 | 9/2010 | Allemand et al. | |
| 2010/0267205 A1 | 10/2010 | Ward et al. | |
| 2010/0270058 A1 | 10/2010 | Mahoney et al. | |
| 2010/0324656 A1 | 12/2010 | Lashmore et al. | |
| 2010/0328845 A1 | 12/2010 | Hiralal et al. | |
| 2011/0005808 A1 | 1/2011 | White et al. | |
| 2011/0007477 A1 | 1/2011 | Xu et al. | |

(56) References Cited

U.S. PATENT DOCUMENTS

| | | |
|---|---|---|
| 2011/0027491 A1 | 2/2011 | Rueckes et al. |
| 2011/0214850 A1 | 9/2011 | Lashmore et al. |
| 2012/0045385 A1 | 2/2012 | Lashmore et al. |
| 2012/0118552 A1 | 5/2012 | White et al. |
| 2014/0034633 A1 | 2/2014 | Heintz et al. |

FOREIGN PATENT DOCUMENTS

| | | | |
|---|---|---|---|
| EP | 1160861 A2 | 12/2001 | |
| JP | 1958-072036 | 5/1983 | |
| JP | 8 035069 | 2/1996 | |
| JP | 09-129793 | 5/1997 | |
| JP | H09509779 | 9/1997 | |
| JP | H09298260 | 11/1997 | |
| JP | 2000-058228 | 2/2000 | |
| JP | 2000058228 A * | 2/2000 | ............... H05B 3/00 |
| JP | 2003518330 | 6/2003 | |
| JP | 2003-298338 | 10/2003 | |
| JP | 2004-051852 | 2/2004 | |
| JP | 2004253796 | 9/2004 | |
| JP | 2004-315297 | 11/2004 | |
| JP | 2005502792 | 1/2005 | |
| JP | 2005-075672 | 3/2005 | |
| JP | 2005-109870 | 4/2005 | |
| JP | 2005-116839 | 4/2005 | |
| JP | 2005/281672 | 10/2005 | |
| JP | 2006-335604 | 12/2006 | |
| JP | 2007-009213 | 1/2007 | |
| JP | 2007-182352 | 7/2007 | |
| JP | 2002-515847 | 5/2008 | |
| JP | 2008523254 | 7/2008 | |
| JP | 2011504280 | 2/2011 | |
| KR | 2005-0007886 | 1/2005 | |
| KR | 2005-0007886 A * | 1/2005 | |
| WO | WO 98/39250 | 9/1998 | |
| WO | WO 02/055769 | 7/2002 | |
| WO | WO 03/080905 | 10/2003 | |
| WO | WO 2005/098084 | 10/2005 | |
| WO | WO 2006/052039 | 5/2006 | |
| WO | WO 2006/069007 | 6/2006 | |
| WO | WO 2006/073460 | 7/2006 | |
| WO | WO 2007/003879 | 1/2007 | |
| WO | WO 2007/015710 | 2/2007 | |
| WO | WO 2007/086909 | 8/2007 | |
| WO | WO 2007/089118 | 8/2007 | |
| WO | WO 2007089118 A1 * | 8/2007 | ............... H05B 3/14 |
| WO | WO2008/002071 | 1/2008 | |
| WO | WO 2008/036068 | 3/2008 | |
| WO | WO 2008/048286 | 4/2008 | |
| WO | 2008054364 | 5/2008 | |
| WO | 2009064133 | 5/2009 | |
| WO | WO 2006/099156 | 9/2009 | |
| WO | WO2009155267 | 12/2009 | |
| WO | WO 2011/005964 | 1/2011 | |

OTHER PUBLICATIONS

Kaili, et al., "Spinning Continuous Carbon Nanotube Yarns", Nature, Oct. 24, 2002, vol. 419, p. 801.
Li, et al., "Direct Spinning of Carbon Nanotube Fibers from Chemical Vapor Deposition Synthesis", Apr. 9, 2004, vol. 304, pp. 276-278.
Tapaszto, et al., "Diameter and Morphology Dependence on Experimental Conditions of Carbon Nanotube Arrays Grown by Spray Pyrolysis", Carbon, Jan. 2005; vol. 43, pp. 970-977.
Non-Final Office Action in U.S. Appl. No. 12/140,263 mailed Sep. 20, 2010.
Non-Final Office Action in U.S. Appl. No. 12/187,278 mailed Sep. 29, 2010.
Non-Final Office Action in U.S. Appl. No. 12/038,408 mailed Oct. 14, 2010.
Non-Final Office Action in U.S. Appl. No. 12/437,537 mailed Oct. 25, 2010.
Final Office Action in U.S. Appl. No. 12/191,765 mailed Oct. 28, 2010.
Supplementary European Search Report based on EP 06851553.5 dated Nov. 15, 2010.
Li, et al. *Direct Spinning of Carbon Nanotube Fibers from Chemical Vapor Deposition Synthesis*, Science Magazine, 2004, vol. 304, pp. 276-278.
R.T.K. Baker et al., "Nucleation and Growth of Carbon Deposits from the Nickel Catalyzed Decomposition of Acetylene", Journal of Catalysis, 26:51-62 (1972).
H.W. Kroto et al., "C60: Buckminsterfullerene", Letters to Nature, 318:162-163, (1985).
Sumio Iijima, "Helical microtubules of graphitic carbon", Letters to Nature, 354:56-58, (1991).
D.S. Bethune et al., Cobalt-catalyzed growth of carbon nanotubes with single-atomic-layer walls, Letters to Nature, 363:605-607 (1993).
M. Jose-Yacaman et al., "Catalytic growth of carbon microtubules with fullerene structure", Applied Physics Letters, 62(6):657-659 (1993).
Gun-Do Lee et al, "Catalytic decomposition of acetylene on Fe(001): A first principles study", The American Physical Society, Physical Review B66 081403R:1-4 (2002).
N. Seo Kim et al., "Dependence of the Vertically Aligned Growth of Carbon Nanotubes on the Catalysts", The Journal of Physical Chemistry, 106(36):9286-9290 (2002).
H. W. Zhu et al., "Direct Synthesis of Long Single-Walled Carbon Nanotube Strands", Science, 296:884-886 (2002).
Ki-Hong Lee et al., "Control of growth orientation for carbon nanotubes", Applied Physics Letters, 82(3): 448-450, (2003).
E. F. Kukovitsky et al., "CVD growth of carbon nanotube films on nickel substrates", Applied Surface Science, 215:201-208 (2003).
Gou, J.G., "Single-Walled Carbon Nanotube Bucky Paper/Epoxy Composites: Molecular Dynamics Simulation and Process Development", PhD dissertation, The Florida State University, 2002, p. 9-126.
Okabe, T. et al., *New Porous Carbon Materials, Woodceramics: Development and Fundamental Properties*, Journal of Porous Materials, vol. 2, pp. 207-213, 1996.
Seung-Yup Lee et al., *Synthesis of Carbon Nanotubes Over Gold Nanoparticle Supported Catalysts*, Carbon, 43 (2005), pp. 2654-2663.
PCT International Search Report based on PCT/US06/27918 dated Sep. 23, 2008.
PCT International Search Report based on PCT/US09/043208 dated Jun. 26, 2009.
PCT International Search Report based on PCT/US09/043212 dated Jul. 1, 2009.
Gou, J.G., "Passage: Nanotube Bucky Papers and Nanocomposites", Ph.D. Dissertation, Marburg An Der Lahn, pp. 93-126, Jan. 1, 2002.
Hanson, G.W., "Fundamental Transmitting Properties of Carbon Nanotube Antennas", IEEE Transactions on Antennas and Propagation, vol. 53, No. 11, pp. 3426-3435, Nov. 2005.
Merriam Webster Dictionary definition of "along", available at http://merriam-webster.com/dictionary/along (retrieved Sep. 16, 2010).
"Metallurgical & Chemical Engineering", McGraw Publishing Co., vol. 15, No. 5, pp. 258-259, Dec. 15, 1916.
Schaevitz et al., "A Combustion-Based Mems Thermoelectric Power Generator", The 11th Conference on Solid-State Sensors and Actuators, Munich, Germany, Jun. 10-14, 2001.
Xiao et al., "High-Mobility Thin-Film Transistors Based on Aligned Carbon Nanotubes", Applied Physics Letters, vol. 83, No. 1, pp. 150-152, Jul. 7, 2003.
Office Action cited in U.S. Appl. No. 11/413,512 mailed Jul. 8, 2010.
Office Action cited in U.S. Appl. No. 11/415,927 mailed Feb. 22, 2010.
Office Action cited in U.S. Appl. No. 11/415,927 mailed Sep. 9, 2010.
Office Action cited in U.S. Appl. No. 11/715,756 mailed Jan. 25, 2010.
Office Action cited in U.S. Appl. No. 11/818,279 mailed Jun. 2, 2010.
Office Action cited in U.S. Appl. No. 12/187,278 mailed Jun. 11, 2010.
Office Action cited in U.S. Appl. No. 12/191,765 mailed May 14, 2010.
Office Action cited in U.S. Appl. No. 12/390,906 mailed Jul. 9, 2010.

(56) References Cited

OTHER PUBLICATIONS

International Search Report based on PCT/US2009/043209 dated Mar. 3, 2010.
International Search Report based on PCT/US2010/041374 dated Sep. 8, 2010.
European Search Report based on EP 06849762.7 dated Jan. 14, 2010.
Australian Examiner's Report cited in AU Serial No. 2006249601 dated Jun. 24, 2010.
Australian Examiner's Report cited in AU Serial No. 2006350110 dated Feb. 9, 2010.
Moisala et al., "Single-walled carbon nanotube synthesis using ferrocene and iron pentacarbonyl in a laminar flow reactor," *Chemical Engineering Science*, 61(13), pp. 4393-4402 (Jul. 2006).
Official Action cited in JP Serial No. 2008-540155 dated Mar. 8, 2011.
Final Office Action in U.S. Appl. No. 12/140,263 mailed Mar. 9, 2011.
Non-Final Office Action in U.S. Appl. No. 11/415,927 mailed Mar. 10, 2011.
Non-Final Office Action in U.S. Appl. No. 12/180,300 mailed Mar. 16, 2011.
Non-Final Office Action in U.S. Appl. No. 12/191,765 mailed Apr. 4, 2011.
Non-Final Office Action in U.S. Appl. No. 12/566,229 mailed Apr. 6, 2011.
International Search Report for International Patent Application No. PCT/US2012/020194 mailed May 1, 2012.
European Search Report based on EP 11168621.8 dated Jul. 8, 2011.
European Search Report based on EP 09816625.9 dated Sep. 7, 2011.
"Battelle's Anti-Icing System Advances in Research Program," *MarketWatch, The Wall Street Journal*, Press Release, (Oct. 26, 2011). Accessed at <http://www.marketwatch.com/story/batteles-anti-icing-system-advances-in-research-program-2011-10-26>.
Official Action cited in JP Serial No. 2008-540155 dated Nov. 4, 2011.
Official Action cited in JP Serial No. 2008-513499 dated Nov. 22, 2011.
Pipes et al., "Helical carbon nanotube arrays: mechanical properties," Composites Science and Technology. 62: 419-428 (2002).
Canadian Search Report for Canadian Patent Application No. 2,609,712 mailed Jul. 30, 2012.
European Search Report for European Patent Application No. 10160098.9 mailed Mar. 9, 2012.
European Search Report for European Patent Application No. 12160856.6 mailed May 22, 2012.
European Search Report for European Patent Application No. 08726128.5 mailed Aug. 10, 2012.
International Search Report for International Patent Application No. PCT/US12/33300 mailed Jul. 5, 2012.
Japanese Office Action issued for Japanese Patent Application No. 2009-551705 mailed on May 29, 2012.
Office Action issued for Australian Patent Application No. 2008311234 mailed on Feb. 14, 2012.
Office Action issued for U.S. Appl. No. 12/038,408 mailed on Feb. 23, 2012.
Office Action issued for U.S. Appl. No. 12/580,994 mailed on Mar. 12, 2012.
Office Action issued for U.S. Appl. No. 12/437,538 mailed on Mar. 26, 2012.
Office Action issued for U.S. Appl. No. 12/566,229 mailed on May 4, 2012.
Office Action issued for U.S. Appl. No. 12/437,535 mailed on Aug. 22, 2012.
International Search Report for International Patent Application No. PCT/US12/48665 mailed Nov. 20, 2012.
Office Action issued for U.S. Appl. No. 12/437,538 mailed on Oct. 16, 2012.
Office Action issued for U.S. Appl. No. 12/841,768 mailed on Mar. 13, 2013.
Office Action issued for Japanese Patent Application No. 2010-520290 mailed on Sep. 11, 2012.
Office Action issued for Japanese Patent Application No. 2011-508689 mailed on Mar. 19, 2013.
International Search Report in International Applicatoin No. PCT/US2013/022873 mailed Sep. 27, 2013.
European Search Report in European Application No. EP09743711 mailed on Oct. 8, 2013.
Office Action in U.S. Appl. No. 13/560,582 mailed Dec. 24, 2014.
Office Action in U.S. Appl. No. 12/841,768 mailed Aug. 5, 2014.
Office Action in U.S. Appl. No. 13/294,698 mailed Jul. 17, 2014.
Office Action in U.S. Appl. No. 12/187,278 mailed Aug. 5, 2014.
Office Action in U.S. Appl. No. 13/445,576 mailed Sep. 9, 2014.
Office Action in U.S. Appl. No. 12/437,537 mailed Mar. 7, 2014.
Japanese Office Action in Japanese Application No. 2011-508688 dated Jun. 26, 2014.
Office Action in U.S. Appl. No. 13/367,572 mailed Aug. 26, 2014.
European Extended Search Report for 11839038.4 mailed Mar. 25, 2015.

\* cited by examiner

NANOSTRUCTURE-BASED HEATING DEVICES AND METHODS OF USE

RELATED U.S. APPLICATION(S)

This application claims priority to U.S. Provisional Patent Application Ser. No. 61/051,249, filed May 7, 2008, U.S. Provisional Patent Application Ser. No. 61/163,301 filed Mar. 25, 2009, and U.S. Provisional Patent Application Ser. No. 61/166,146 filed Apr. 2, 2009, all of which are hereby incorporated by reference herein in their entirety.

TECHNICAL FIELD

The present invention relates to nanostructure-based devices, and more particularly, heaters manufactured from nanostructured materials.

BACKGROUND ART

Within the last fifteen (15) years, as the properties of carbon nanotubes have been better understood, interests in carbon nanotubes have greatly increased within and outside of the research community. One key to making use of these properties is the synthesis of nanotubes in sufficient quantities for them to be broadly deployed. For example, large quantities of carbon nanotubes may be needed if they are to be used as high strength components of composites in macroscale structures (i.e., structures having dimensions greater than 1 cm).

Carbon nanotubes are known to have extraordinary tensile strength, including high strain to failure and relatively high tensile modulus. Carbon nanotubes may also be highly electrically and thermally conductive while being resistant to fatigue, radiation damage, and heat.

Accordingly, it would be desirable to provide a material that can take advantage of the characteristics and properties of carbon nanotubes (CNT), so that efficient and light-weight devices, such as heaters, can be manufactured in a cost-effective manner, while being capable of being incorporated within or used in connection with other devices.

SUMMARY OF THE INVENTION

In one aspect, the invention features a heating device that can include a thermally conducting member made from a matrix of carbon nanotubes and having opposing ends. A connector portion can be positioned at each end of the conducting member, and can be capable of receiving a current from an external source to permit the conducting member to generate heat. The heating device can further include a coupling mechanism associated with the connector portion, so as to provide the connector portion with substantially uniform contact across a contact surface area with the conducting member.

One or more of the following features may also be included. A thermally conductive body can be coupled to the conducting member to permit expansion of a heating zone of the conducting member. The thermally conductive body can be made from one of a woven or non-woven sheet of carbon graphite, a woven or non-woven sheet of carbon nanotubes, a graphite epoxy material, other composite materials, a metal, a metal alloy, any other thermally conductive material or a combination thereof. A resin material incorporated and dispersed throughout the conducting member. An insulating component so as to minimize leakage of current from the device. The heating device can be designed to be coupled to another device, structure or component to provide heat thereto. The heating device can be designed to be embedded within a device, structure or component to provide heat thereto. The heating device can be designed to be coupled to or embedded within a device, structure or component including one of a satellite, satellite housing, other satellite parts or components, fuel lines, rockets, spacecrafts, airplanes, automobiles, batteries, motors, or any other structures or components in need of being heated. The heating device can be used in connection with de-icing of a structure, device or component.

In another aspect, the invention features a method that includes providing a heater having 1) a thermally conducting member made from a matrix of carbon nanotubes and having opposing ends, 2) a connector portion positioned at each end of the conducting member capable of receiving a current from an external source to permit the conducting member to generate heat, and 3) a coupling mechanism associated with the connector portion so as to provide the connector portion with substantially uniform contact across a contact surface area with the conducting member. The method can include attaching the heater to a device, structure, or component in need of being heated. The method can include passing a current through the heater to permit the conducting member to generate heat. The method can further include heating the device, structure, or component to desired levels.

One or more of the following features may also be included. Expanding the conducting member of the heater to accommodate thermal expansion of the device, structure, or component during heating. Attaching the heater can include coupling the heater to an interior surface of the device, structure, or component. Attaching the heater can include coupling the heater to an exterior surface of the device, structure, or component. Attaching the heater can include embedding the heater into the device, structure, or component. Passing a current through the heater can include connecting a power source to the connector portion of the heater. Heating the device, structure, or component includes de-icing the device, structure, or component.

DESCRIPTION OF SPECIFIC EMBODIMENTS

Figure 1:
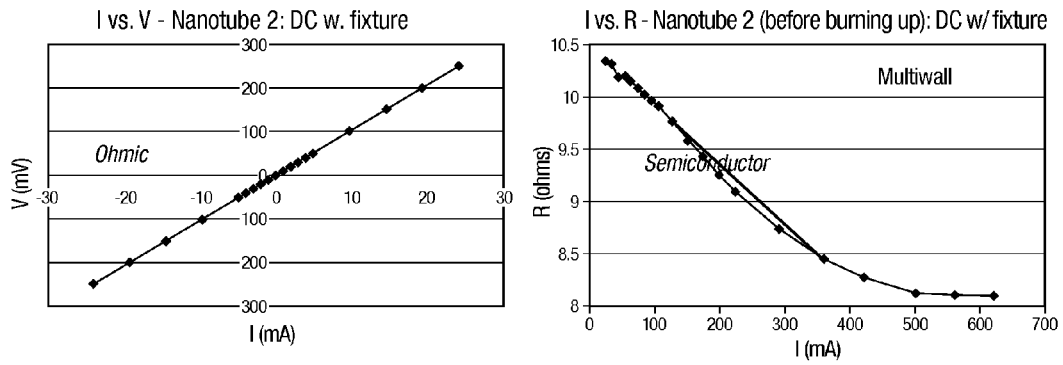
FIG. 1 illustrates electrical properties of carbon nanotubes made in accordance with one embodiment of the present invention.

Heaters, made from carbon nanotubes generated in accordance with an embodiment of the present invention, can be used in a wide variety of applications. These heaters have a number of advantages over wired-based heaters, including greater fatigue resistance, greater usability at high temperatures (350° C.), high impact resistance, corrosion resistance, UV resistance, and significant weight savings.

Nanostructures, such as carbon nanotubes, for use in the manufacturing of heaters of the present invention may be fabricated using a variety of approaches. Presently, there exist multiple processes and variations thereof for growing nanotubes, and forming sheets or cable structures made from these nanotubes. These include: (1) Chemical Vapor Deposition (CVD), a common process that can occur at near ambient or at high pressures, and at temperatures above about 400° C., (2) Arc Discharge, a high temperature process that can give rise to tubes having a high degree of perfection, and (3) Laser ablation.

The present invention, in one embodiment, employs a CVD process or similar gas phase pyrolysis procedures known in the industry to generate the appropriate nanostructures, including carbon nanotubes. Growth temperatures for a CVD process can be comparatively low ranging, for instance, from about 400° C. to about 1350° C. Carbon nanotubes, including single wall (SWNT), double wall (DWNT), and multiwall (MWNT), may be grown, in an embodiment of the present invention, by exposing nanoscaled catalyst particles in the presence of reagent carbon-containing gases (i.e., gaseous carbon source). In particular, the nanoscaled catalyst particles may be introduced into the reagent carbon-containing gases, either by addition of existing particles or by in situ synthesis of the particles from a metal-organic precursor, or even non-metallic catalysts. Although SWNT, DWNT, and MWNT may be grown, in certain instances, SWNT may be selected due to their relatively higher growth rate and tendency to form rope-like structures, which may offer advantages in handling, thermal conductivity, electronic properties, and strength. In other instances, DWNT may be grown for thermal properties that are advantageous for thermal applications, such as heaters.

The strength of the individual carbon nanotubes generated in connection with the present invention may be about 30 GPa or more. Strength, as should be noted, is sensitive to defects. However, the elastic modulus of the carbon nanotubes fabricated in the present invention may not be sensitive to defects and can vary from about 1 to about 1.2 TPa. Moreover, the strain to failure of these nanotubes, which generally can be a structure sensitive parameter, may range from a about 10% to a maximum of about 25% in the present invention.

Furthermore, the nanotubes of the present invention can be provided with relatively small diameter. In an embodiment of the present invention, the nanotubes fabricated in the present invention can be provided with a diameter in a range of from less than 1 nm to about 10 mm.

Figure 2:
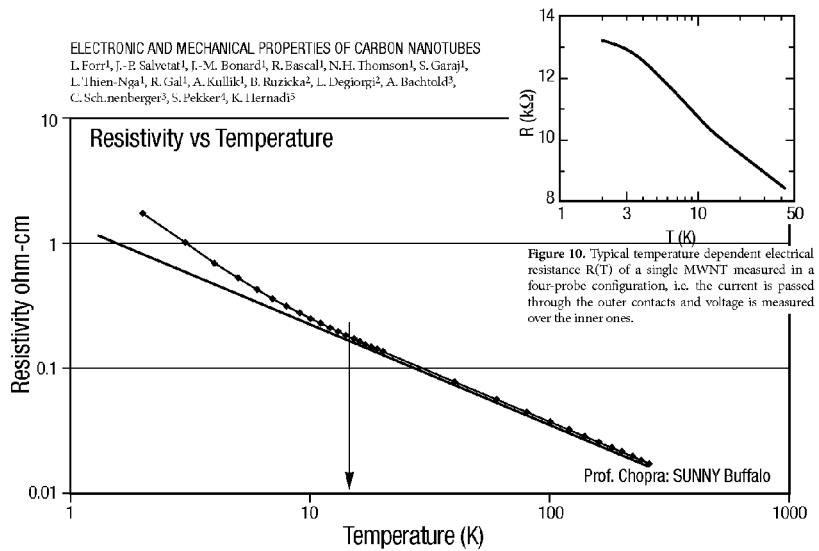
FIG. 2 illustrates resistivity of carbon nanotubes of the present invention in relation to temperature.
Figure 3:
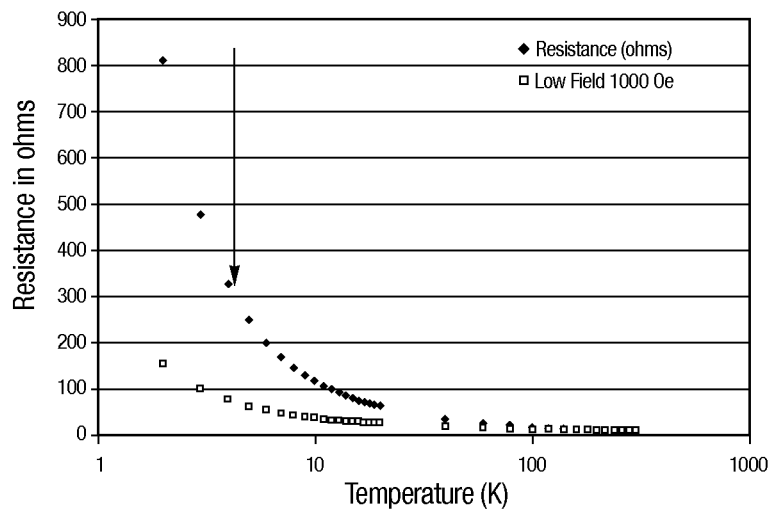
FIG. 3 illustrates characteristics of carbon nanotube resistivity versus temperature in (and out of) the presence of a magnetic field, in accordance with an embodiment of the present invention.

Referring to FIGS. 1-3, carbon nanotubes of the present invention can exhibit certain characteristics. FIG. 1 illustrates the electrical properties of carbon nanotubes made in accordance with one embodiment of the present invention. FIG. 2 illustrates resistivity of these carbon nanotubes in relation to temperature. FIG. 3 illustrates characteristics of carbon nanotube resistivity versus temperature in (and out of) the presence of a magnetic field.

Figure 4:
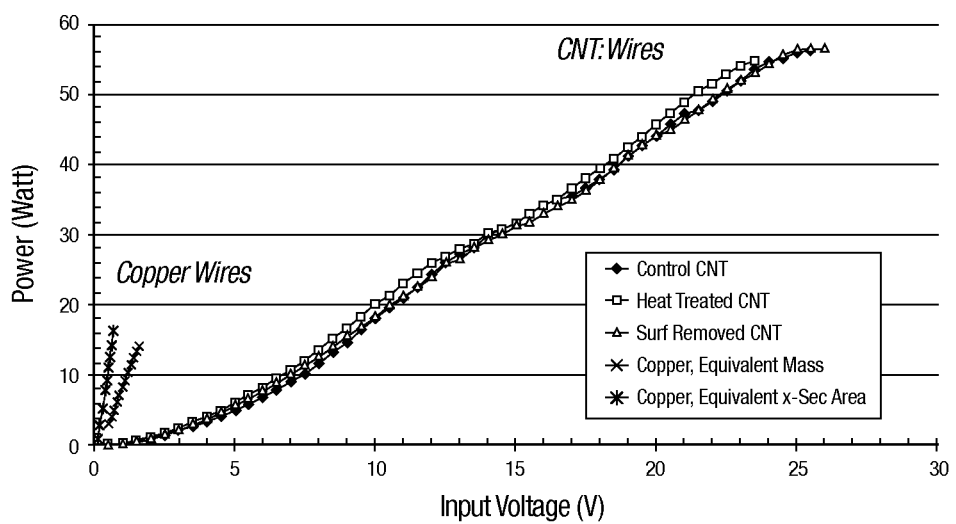
FIG. 4 illustrates characteristics of carbon nanotubes in accordance with an embodiment of the present invention.

Referring to FIG. 4, carbon nanotube-based materials of the present invention may be utilized in the design, and development of more powerful heaters than can be achieved with copper wires. As shown in FIG. 4, these carbon nanotubes can be utilized at higher power and voltage levels than copper wires having substantially equivalent mass or cross-sectional area. As such, carbon nanotube materials of the present invention can be utilized to increase efficiency and power output of heaters.

Figure 5:
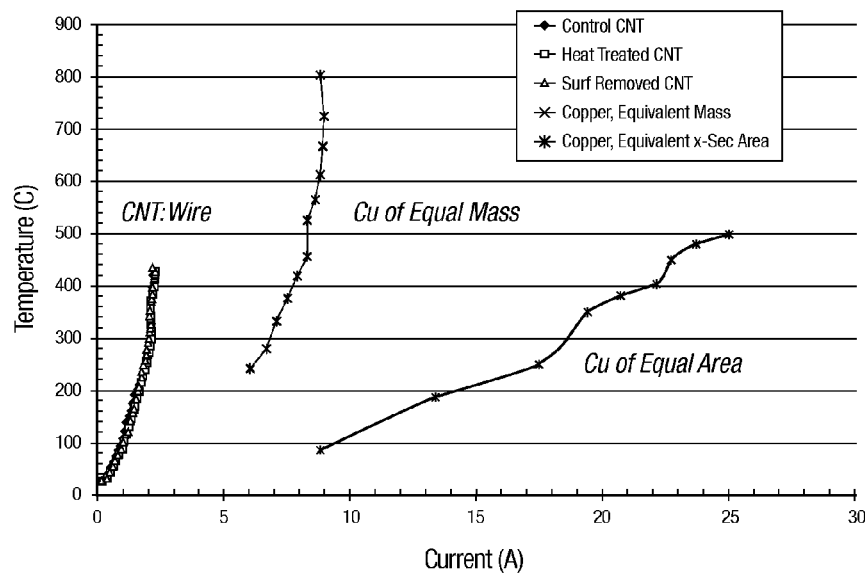
FIG. 5 illustrates characteristics of carbon nanotubes in accordance with an embodiment of the present invention.

Referring to FIG. 5, in addition to being more powerful heaters, carbon nanotube wires of the present invention may be able to generate more heat with less current. As shown in FIG. 5 below, these carbon nanotube wires may be able to generate a substantially greater amount of heat with substantially less current than copper wires of equal mass or copper wires of equal area. Therefore, heaters made from these carbon nanotubes can be more effective at generating heat with using less current than are copper wires.

System for Fabricating Nanotubes

Figure 6A:
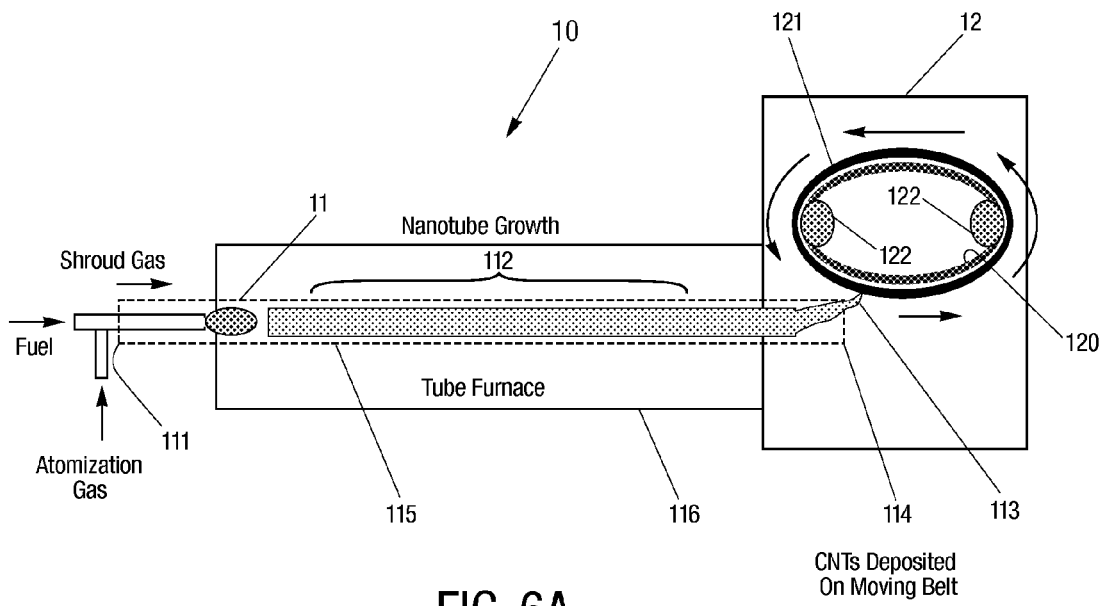
FIGS. 6A-6B illustrate a Chemical Vapor Deposition system for fabricating a continuous sheet of nanotubes, in accordance with one embodiment of the present invention.

With reference now to FIG. 6A, there is illustrated a system 10, similar to that disclosed in U.S. patent application Ser. No. 11/488,387, incorporated herein by reference, for use in the fabrication of nanotubes. System 10, in an embodiment, may be coupled to a synthesis chamber 11. The synthesis chamber 11, in general, includes an entrance end 111, into which reaction gases (i.e., gaseous carbon source) may be supplied, a hot zone 112, where synthesis of extended length nanotubes 113 may occur, and an exit end 114 from which the products of the reaction, namely the nanotubes and exhaust gases, may exit and be collected. The synthesis chamber 11, in an embodiment, may include a quartz tube 115 extending through a furnace 116. The nanotubes generated by system 10, on the other hand, may be individual single-walled nanotubes, bundles of such nanotubes, and/or intertwined single-walled nanotubes (e.g., ropes of nanotubes).

System 10, in one embodiment of the present invention, may also include a housing 12 designed to be substantially airtight, so as to minimize the release of potentially hazardous airborne particulates from within the synthesis chamber 11 into the environment. The housing 12 may also act to prevent oxygen from entering into the system 10 and reaching the synthesis chamber 11. In particular, the presence of oxygen within the synthesis chamber 11 can affect the integrity and compromise the production of the nanotubes 113.

System 10 may also include a moving belt 120, positioned within housing 12, designed for collecting synthesized nanotubes 113 made from a CVD process within synthesis chamber 11 of system 10. In particular, belt 120 may be used to permit nanotubes collected thereon to subsequently form a substantially continuous extensible structure 121, for instance, a non-woven sheet. Such a non-woven sheet may be generated from a matrix of compacted, substantially non-aligned, and intermingled nanotubes 113, bundles of nanotubes, or intertwined nanotubes (e.g., ropes of nanotubes), with sufficient structural integrity to be handled as a sheet.

To collect the fabricated nanotubes 113, belt 120 may be positioned adjacent the exit end 114 of the synthesis chamber 11 to permit the nanotubes to be deposited on to belt 120. In one embodiment, belt 120 may be positioned substantially parallel to the flow of gas from the exit end 114, as illustrated in FIG. 6A. Alternatively, belt 120 may be positioned substantially perpendicular to the flow of gas from the exit end 114 and may be porous in nature to allow the flow of gas carrying the nanomaterials to pass therethrough. Belt 120 may be designed as a continuous loop, similar to a conventional conveyor belt. To that end, belt 120, in an embodiment, may be looped about opposing rotating elements 122 (e.g., rollers) and may be driven by a mechanical device, such as an electric motor. Alternatively, belt 120 may be a rigid cylinder. In one embodiment, the motor may be controlled through the use of a control system, such as a computer or microprocessor, so that tension and velocity can be optimized. The collected nanotubes may be removed as a sheet manually off of belt 120 or by any other means available in the art.

Figure 6B:
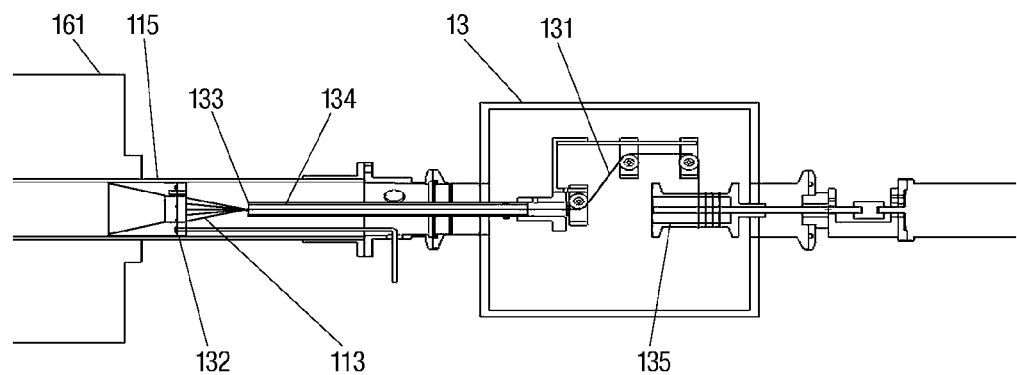

With reference now to FIG. 6B, in an alternate embodiment, instead of a non-woven sheet, the fabricated single-walled nanotubes 113 may be collected from synthesis chamber 11, and a yarn 131 may thereafter be formed. Specifically, as the nanotubes 113 emerge from the synthesis chamber 11, they may be collected into a bundle 132, fed into intake end 133 of a spindle 134, and subsequently spun or twisted into yarn 131 therewithin. It should be noted that a continual twist to the yarn 131 can build up sufficient angular stress to cause rotation near a point where new nanotubes 113 arrive at the spindle 134 to further the yarn formation process. Moreover, a continual tension may be applied to the yarn 131 or its advancement into collection chamber 13 may be permitted at a controlled rate, so as to allow its uptake circumferentially about a spool 135.

Typically, the formation of the yarn 131 results from a bundling of nanotubes 113 that may subsequently be tightly spun into a twisting yarn. Alternatively, a main twist of the yarn 131 may be anchored at some point within system 10 and the collected nanotubes 113 may be wound on to the twisting yarn 131. Both of these growth modes can be implemented in connection with the present invention.

Heaters

Figure 7:
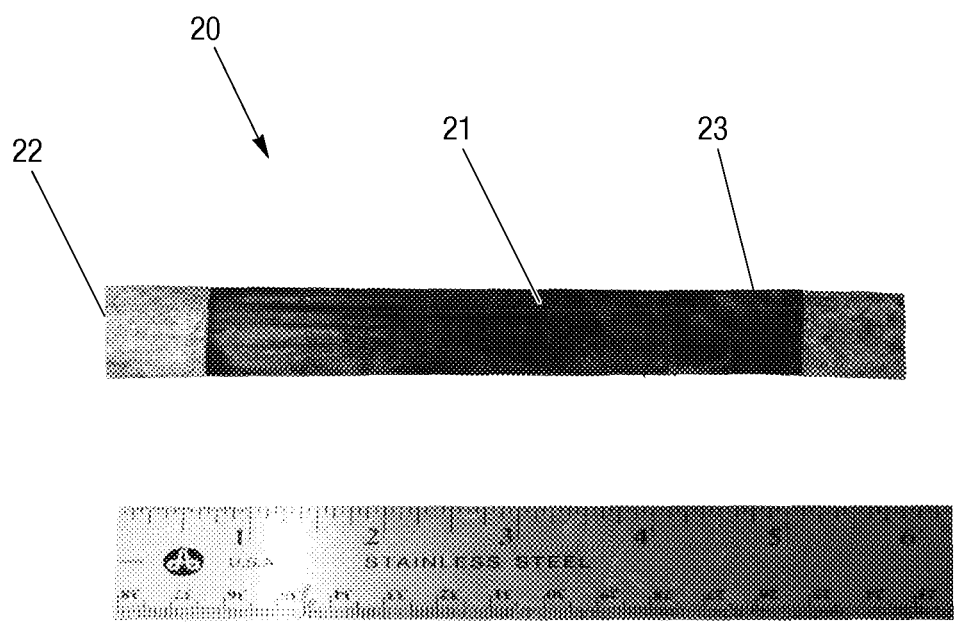
FIG. 7 illustrates a heater in accordance with one embodiment of the present invention.

Looking now at FIG. 7, in accordance with an embodiment of the present invention, there is shown a heater 20. Heater 20 includes a conducting member 21 made from a conductive nanostructure-based material. The conductive nanostructure-based material, in an embodiment, may be made from a sheet of non-woven nanostructured materials, for instance, carbon nanotubes, such as that disclosed above. Such a sheet, if desired, can be cut into strips to provide the conducting member 21. Of course, conducting member 21 can be a woven nanostructured material, weaved from carbon nanotube materials such as wires, yarns, ribbons etc, as disclosed above. In an embodiment, conducting member 21 may be made from one of carbon, copper, silver, boron-nitride, boron, $MoS_2$, or a combination thereof. The material from which the conducting member 21 may be made can also include, in an embodiment, graphite of any type, for example, such as that from pyrograph fibers. In an embodiment, the heaters 20 may be manufactured from double wall carbon nanotube non-woven sheets or strips.

Heater 20, as illustrated, can also include a connector portion 22 at each of opposing ends of the conducting member 21. In one embodiment of the invention, connector portion 22 may be a coating deposited, such as electroplating, directly on each end of conducting member 21. Deposition or electroplating of connector portion 22 on to conducting member 21 can be carried out using methods well known in the art. Examples of electroplated connector portion 22 include gold, silver, nickel, aluminum, copper, bismuth, tin, zinc, cadmium, tin-nickel alloy, copper alloy, tin-zinc alloy, bismuth-copper alloy, copper-nickel alloy, cadmium-nickel alloy, other conductive metals and their alloys, or a combination thereof. In an embodiment, one or more connector portions 22 may be located anywhere on the conducting member 21.

Connector portion 22, in an embodiment, may be deposited or electroplated on to conducting member 21 substantially uniformly, so as to permit substantially uniform contact of the nanotubes in conducting member 21 across a contact surface area on the connector portion 22. As such, the connector portion 22 can act to substantially maximize the number of conductive nanostructures within the conducting member 21 that can be actively involved in conductivity to enhance efficiency of electrical and thermal transport and reduce contact resistance. To that end, relatively high current from a source and carried by the conducting member 21 can be directed to an external circuit without substantial degradation. The heater 20, thus, can be used to enable efficient interaction, for instance, through thermal and/or electrical conduction, between a nanoscale environment and the traditional thermal and/or electrical circuit system, as well as conduction to a standard connector for use in a traditional thermal and/or electrical circuit systems.

The connector portion 22, in an embodiment, when coupled to conducting member 21, permits relatively high current from a source that may be carried by the conducting member 21 to be directed to an external circuit without substantial degradation. To do so, the heater 20 may further include a coupling mechanism 23 to enhance contact between the conducting member 21 to the connector portion 22. In one embodiment, the coupling mechanism 23 may be made from a glassy carbon material capable of providing substantially low resistance coupling. Glassy carbon, in general, may be a form of carbon related to carbon nanotubes and can contain a significant amount of graphene like ribbons comprising a matrix of amorphous carbon. These ribbons include $sp^2$ bonded ribbons that can be substantially similar to the $sp^2$ bonded nanotubes. As a result, they can have relatively good thermal and electrical conductivity. Examples of precursor materials from which glassy carbon can be made include furfuryl alcohol, RESOL resin (i.e., catalyzed alkyl-phenyl formaldehyde), PVA, or liquid resin or any material known to form glassy carbon when heat treated. Of course, other commercially available glassy carbon materials or precursor materials can be used.

In addition, coupling mechanism 23 may also provide the conducting member 21 with substantially uniform contact to the connector portion 22 across a contact surface area on the connector portion 22. To that end, the coupling mechanism 23 can act to substantially maximize the number of conductive nanostructures within the conducting member 21 that can be actively involved in conductivity to enhance efficiency of electrical and thermal transport. For instance, relatively high current from a source and carried by the conducting member 21 can be directed to an external circuit without substantial degradation. The heater 20 of the present invention, thus, can be used to enable efficient conduction to a standard connector for use in a traditional thermal and/or electrical circuit systems. In particular, heater 20 can enable efficient interaction, for instance, through thermal and/or electrical conduction, between a nanoscale environment and the traditional thermal and/or electrical circuit system.

In an embodiment, the connector portion 21 of heater 20 may be impregnated with epoxy, polymeric resin, or another type of bonding agent to increase structural integrity.

In one embodiment, a sheet of non-woven carbon nanotubes or nanofibers may be coated with an appropriate resin material, such as furfuryl alcohol ($C_5H_6O_2$). The coating of resin material can infiltrate the voids between the overlapping carbon nanotubes. The amount of furfuryl alcohol used may be determined in accordance with the amount of carbon nanotubes in the non-woven sheet. In particular, the ratio of carbon from the furfuryl alcohol to the carbon in the nanotubes can range, in an embodiment, from about 1:1 to about 10:1. The coating of furfuryl alcohol on the sheet of non-woven carbon nanotubes may then be allowed to evaporate and polymerize with the nanotubes 11 at a temperature ranging from about 50° C. to about 150° C. To the extent that the resin material may be available in a polymerized formed, exposure to heat for polymerization may not be necessary. The non-woven carbon nanotubes may then be exposed to heat ranging from about 125° C. to about 450° C., and at a pressure of at least about 3000 psi for approximately 10 minutes or until the sheet is treated. It should be appreciated that the temperature, pressure and length of time can be dependent of the type of resin selected.

Alternatively, a thin sheet 20 of a polymeric resin, such as RESOL resin, polyamide, epoxy, Krayton, polyethylene, or PEEK (polyaryletherketone) resin, other commercially available resins, or a combination thereof, may be positioned on the non-woven sheet of carbon nanotubes. The non-woven sheet and resin may then be hot pressed at a temperature range of from about 125° C. to about 350° C., and at a pressure of at least about 3000 psi for approximately 10 minutes or until the resin has infiltrated the voids between overlapping nanotubes. By pressing in such a manner, the sheets of polymeric resin may soften and flow to infiltrate voids between overlapping carbon nanotubes. Again, the temperature, pressure and length of time can be dependent of the type of resin selected.

In either embodiment, the infiltrated non-woven sheet may then be subject to pyrolysis for curing. In particular, the sheet may be subject to slowly increasing temperature, for instance, less than 1 degree C. per minute. In an embodiment, the curing temperature may be raised to at least between about 1000° C. and about 2000° C., and more preferably about 1700° C. to form a carbon-carbon composite. This slow heating rate, in one embodiment, allows water, a primary fluid by-product of the reaction, to diffuse out of the sheet and permits the sheet to be cured into the carbon-carbon composite.

The resulting cured sheet may be cut into strips for use as a heater 20 of the present invention To the extent desired, heater 20, in an embodiment, may also be made from a plurality of sheets of a nanostructured material, such as a plurality of non-woven carbon nanotube sheets. In this embodiment, each sheet may be coated with a resin material, such as furfuryl alcohol ($C_5H_6O_2$), and the coating of resin material can infiltrate the voids between the overlapping carbon nanotubes. The sheets may then be layered on one another. If desired, prior to infiltrating the voids with a resin material, a surface treatment process can be applied to the carbon nanotubes to facilitate wetting (i.e., bonding) of the resin material to the nanotubes. Such surface treatment can be implemented by methods well known in the art.

The coating of furfuryl alcohol on the sheets of non-woven carbon nanotubes may then be allowed to evaporate and polymerize with the nanotubes at a temperature ranging from about 50° C. to about 150° C. To the extent that the resin material may be available in a polymerized form, exposure to heat for polymerization may not be necessary.

Thereafter, the coated sheets may be hot pressed to bond the sheets of non-woven carbon nanotubes with one another into a formed mass or structure. The pressing, in one embodiment, may be done at a temperature range of from about 125° C. to about 350° C., and at a pressure of at least about 3000 psi for approximately 10 minutes or until the sheets 10 are bonded to one another. It should be appreciated that the temperature, pressure and length of time can be dependent of the type of resin selected.

Alternatively, a thin sheet 20 of a polymeric resin, such as RESOL resin, polyamide, epoxy, Krayton, polyethylene, or PEEK (polyaryletherketone) resin, other commercially available resins, or a combination thereof, may be positioned between adjacent sheets of non-woven carbon nanotubes.

This layered structure of non-woven sheets and resin may then be hot pressed to bond the sheets of non-woven carbon nanotubes with one another into a formed massed. The pressing, in one embodiment, may be done at a temperature range of from about 125° C. to about 450° C., and at a pressure of at least about 3000 psi for approximately 10 minutes or until bonding of the sheets occurs. By pressing in such a manner, the sheets of polymeric resin may soften and flow to infiltrate voids between overlapping carbon nanotubes within each non-woven sheet, and permit the non-woven sheets to bond with one another to provide a formed mass or structure. Again, the temperature, pressure and length of time can be dependent of the type of resin selected.

It should be appreciated that, similar to the coating approach, if desired, prior to infiltrating the voids with a resin material, a surface treatment process can be applied to the carbon nanotubes to facilitate bonding of the resin material to the nanotubes. Such surface treatment, again, can be implemented by methods well known in the art.

Once bonded, the layered sheets of non-woven carbon nanotubes in formed mass may be subject to pyrolysis for curing. In particular, the formed structure may be subject to slowly increasing temperature, for instance, less than 1 degree C. per minute. In an embodiment, the curing temperature may be raised to at least between about 1000° C. and about 2000° C., and more preferably about 1700° C. to form a carbon-carbon composite. This slow heating rate, in one embodiment, allows water, a primary fluid by-product of the reaction, to diffuse out of the formed structure and permits the structure to be cured into the carbon-carbon composite.

To the extent desired, this cured or pyrolyzed carbon-carbon composite may be hot pressed over or into a mold having a shape of a final product or structure, and may be further pyrolyzed for final curing. Specifically, the composite may be subject to a final ramp temperature up to about 3000° C. to anneal (i.e., remove any defects) the composite in the shape of the desired product or structure.

The resulting single or layered sheets can serve as (i) high current conducting members for high frequency transport of, for instance, very high frequency signals, as well as (ii) very efficient heat conducting members for thermal transport. Table 1 details various properties of CNT-based materials.

TABLE 1

Properties of CNT-based Materials.

| Property | Value | Applications |
| --- | --- | --- |
| Tensile Strength | ~1.2 GPa | Electrical and Thermal Conductors |
| Thermal Conductivity | ~60 Watts/m-° K | Electrical and Thermal Conductors |
| Electrical Conductivity | ~7 × $10^6$ S/m | Electrical and Thermal Conductors |
| Seebeck Coefficient | 65 µV/° K | Thermal Conductors |

Figure 8A:
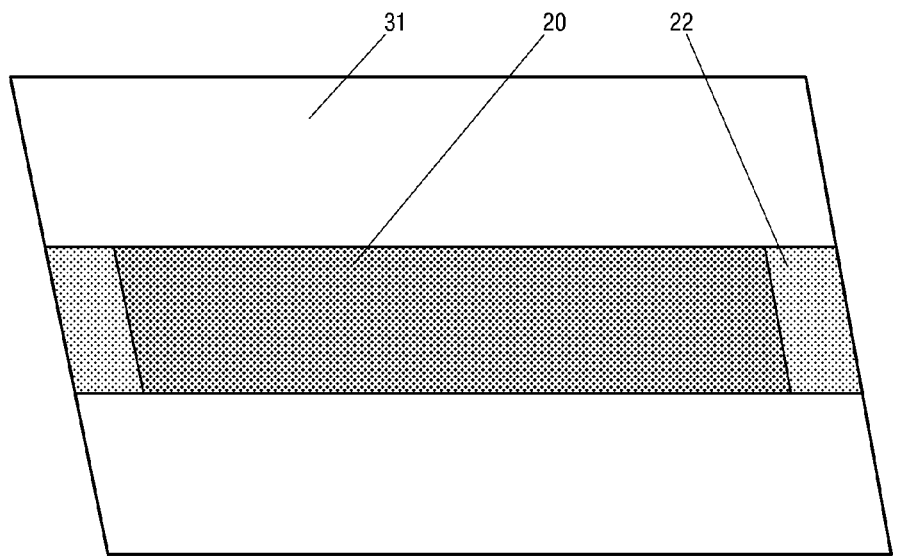
FIGS. 8A-8B illustrate carbon nanotube-based heaters integrally molded on top of or within plies of composite sheets in accordance with various embodiments of the present invention.

Referring now to FIG. 8A, there is a heater 20 in accordance with a further embodiment of the present invention.

Heater 20 may be bonded or otherwise physically coupled to one surface of a thermally conductive composite sheet 31. By coupling heater 20 to a composite sheet 31, the zone of heating may be expanded. Composite sheet 31, for instance, can be made from a prepreg sheet of woven or non-woven sheet of carbon graphite and/or carbon nanotubes, or can be made of a graphite epoxy material. A prepreg sheet may be made of one or more layers of non-woven carbon nanotube sheets that have been infiltrated with a binder or resin material, as discussed above, and heated to a temperature range of from about 125° C. to about 450° C. To form the composite sheet 31, the prepreg sheet or sheets can be exposed to slowly increasing curing temperature, for instance, less than 1 degree C. per minute of at least between about 1000° C. and about 2000° C., and more preferably about 1700° C. This slow heating rate, in one embodiment, allows water, a primary fluid by-product of the reaction, to diffuse out of the formed structure and permits the structure to be cured into the composite material.

To the extent desired, this cured or pyrolyzed composite may be hot pressed over or into a mold having a shape of a final product or structure, and may be further pyrolyzed for final curing. Specifically, the composite may be subject to a final ramp temperature up to about 3000° C. to anneal (i.e., remove any defects) the composite in the shape of the desired product or structure.

In an embodiment, heater 20 can be attached to the composite sheet 31 by using glassy carbon, epoxy, or other gluing and bonding methods known in the art. In addition or alternatively, the heater 20 can be attached by hot pressing, vacuum bagging, autoclaving, or any other means known in the art, including mechanical means such as through fasteners, grommets, etc. In an embodiment, an insulating separator, for instance, a sheet made of polyamide (not shown), may be placed between the heater 20 and the composite sheet 31. In an embodiment, to allow for the inclusion of an insulating separator, between the heater 20 and the composite sheet 31, a material other than a prepreg sheet may be used.

Still referring to FIG. 8A, connector portion 22, connected to heater 20, can be flush with the edges of the composite sheet 31, or can extend out from the composite sheet 31. Connector portion 22 can be copper, copper-nickel, or other suitable metals or alloys. Connector portion 22 can be through-fastened to the composite sheet 31 by any means known in the art, including mechanical means. In a further embodiment, there may be more than one heater 20 bonded to a composite sheet 31. The composite sheets 31 are thermally conductive, and conduct the heat provided by the heaters 20 throughout the composite sheet 31, thus expanding the zone of heating.

Figure 8B:
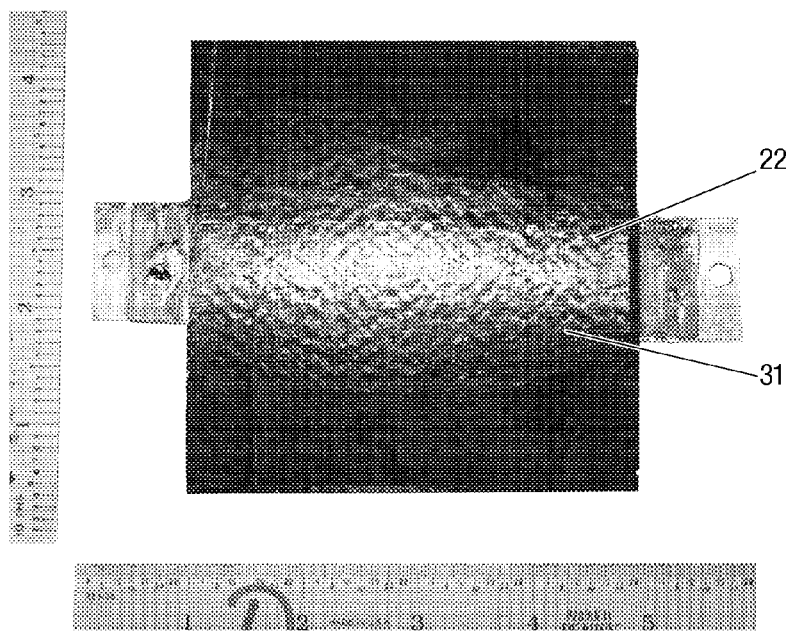

Referring now to FIG. 8B, there is a heater 20 in accordance with a further embodiment of the present invention. The heater 20 may be layered within plies of composite sheets 31, for instance, carbon graphite or carbon epoxy prepreg sheets. In one embodiment the heater 20 can be placed between several layers of composite sheets, which may thereafter be bonded to one another as disclosed above.

Alternatively, a layering operation may include vacuum bagging, hot pressing, or autoclaving. The thermally conductive composite sheets 31 can act to spread the heat energy from the embedded heater 20. Since the heater 20 is positioned between layers of composite sheets 31, connector portion 22 may extend from the edges of the composite sheets 31 in order to permit the application of energy to the conductive member 21. Connector portion 22, in an embodiment, can be electroplated nickel and/or copper, or any other suitable conducting metal or alloy. In another embodiment, there can more than one heater 20 embedded within the composite sheets 31.

The composite sheets 31 can be prepreg sheets of carbonaceous material that contain or is combined with a full complement of resin before a molding operation. Prepreg sheets can also be sheets of carbon composite, carbon graphite and/or carbon nanotubes that contain or are combined with bismaleimide resin (BMI), polyimide resin, or another toughened epoxy prior to a molding operation. In an embodiment, prepreg sheets and/or composite sheets 31 may be obtained from any commercially available source.

It should be appreciated that although composite sheet 31 made from, for instance, carbon nanotubes is disclosed, any thermally conductive material may be used, for instance, metal, capable of spreading heat from heater 20.

Figure 9A:
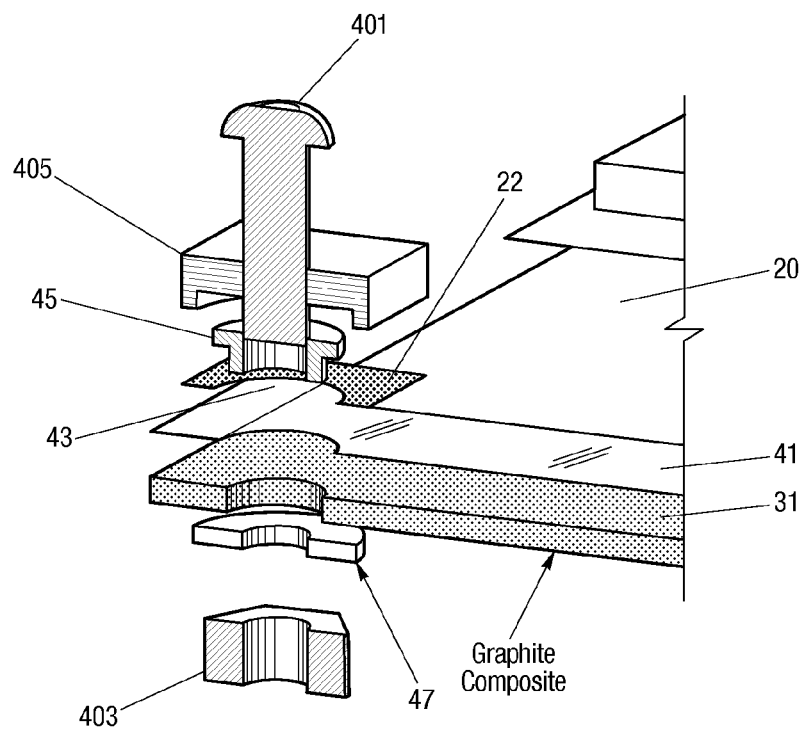
FIGS. 9A-9B illustrate an electrically insulated connection system in accordance with various embodiments of the present invention.

In an embodiment, insulated electrical connections to the heater 20 may be provided, so as to minimize current leakage. Referring now to the exploded view of FIG. 9A, there is a heater 20, lying upon an insulating sheet 41, for instance, a polyamide sheet. A composite sheet 31, lies beneath the insulating sheet 41. The composite sheet 31, insulating sheet 41, and heater 20 may be predrilled to accommodate the insulating pass-through 45 before applying the heater 20. The heater 20 may have an area removed from the attached connector portion 22 slightly larger than the flange diameter of an insulating pass-through 45 to create opening 43. The electrically-insulating pass-through 45, for instance, one made of Rulon, may be inserted into the opening 43, and engages an electrically-insulating washer 47 on the opposite side of the heater 30.

A brass bolt 401 may be inserted through the pass-through 45 and washer 47 and engages the brass nut 403. The nut 403 for the bolt 401 may have an electrically insulating 47 washer placed under it to prevent shorting. A copper contact block 405 can be engaged to the heater 20 by inserting the bolt 401 through the block 405. The copper contact block 405 can be seated over the pass-through 45. The materials described here for the electrically insulated connections may also be made of any other suitable material, metal, or alloy as known in the art.

Figure 9B:
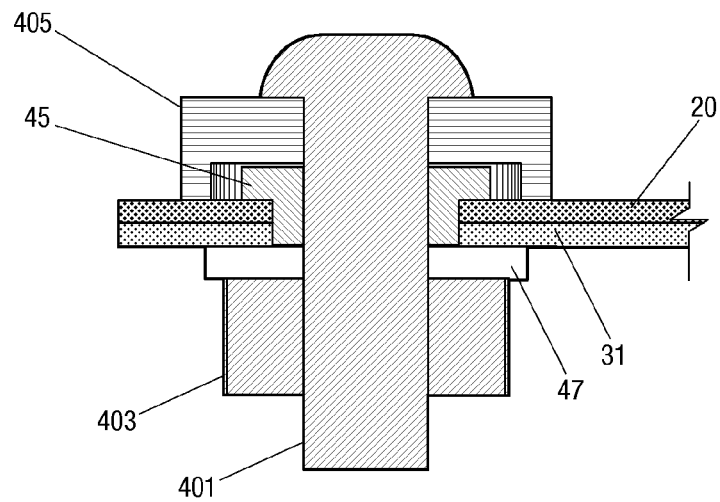

Looking now at FIG. 9B, there is a cross-sectional view of an insulated electrical connection system. The copper contact block 405 may have a small clearance area machined out to clear the flange of the electrically insulating pass-through 45, and allow contact to the connector portion 22 of the heater 20.

The method of assembling the electrically insulated connections with the heater can be as follows: the insulating sheet 41 can be laid on the composite sheet 31; and the pass through 45 placed through both holes. The heater 20 can be then laid over the entire system, epoxy applied, and cured.

Figures 10A, 10B:
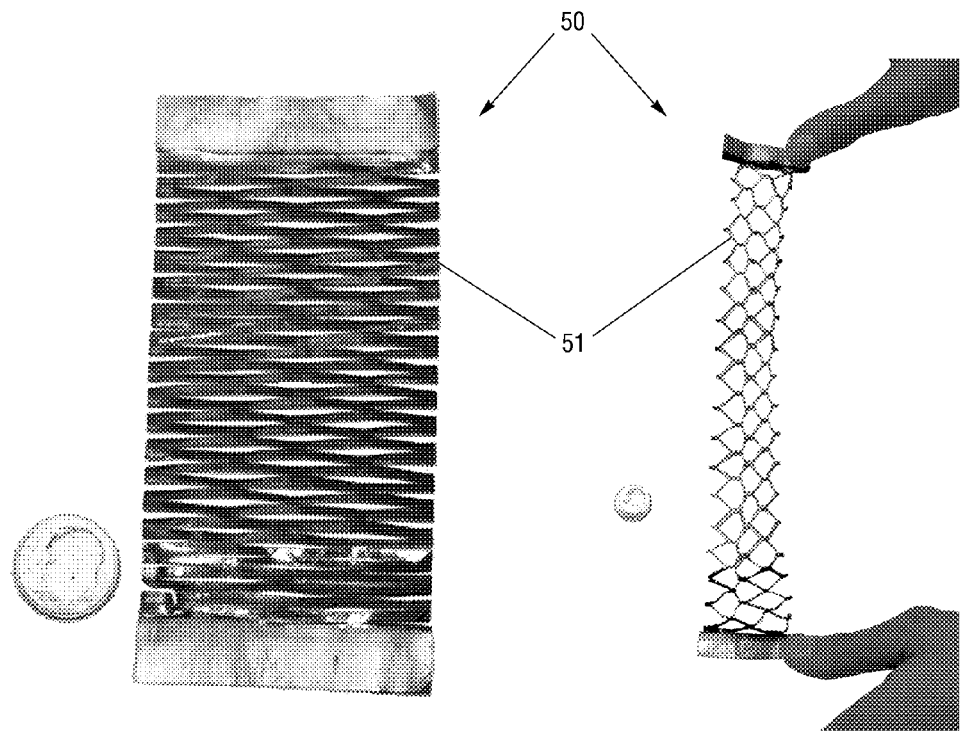
FIGS. 10A-10D illustrate an extendible heater and various nanostructured-based heaters of the present invention.

In an embodiment, the heater 20 may be made extensible. Conducting member 51 may be imparted or etched with various patterns, include that shown in FIGS. 10A-10B to permit the heater 50 to extend or expand, for instance, in a lengthwise direction (i.e. along the X axis) when pulled axially from opposite ends of the adapter (see FIG. 10B). The extensibility of the heater 50 may accommodate the thermal expansion of a device. For instance, the thermal coefficients of expansion for a device in need of heating and that of the heater 50 may be such that the heater 50 should need to "stretch" along with the device throughout a temperature change.

Figure 10C:
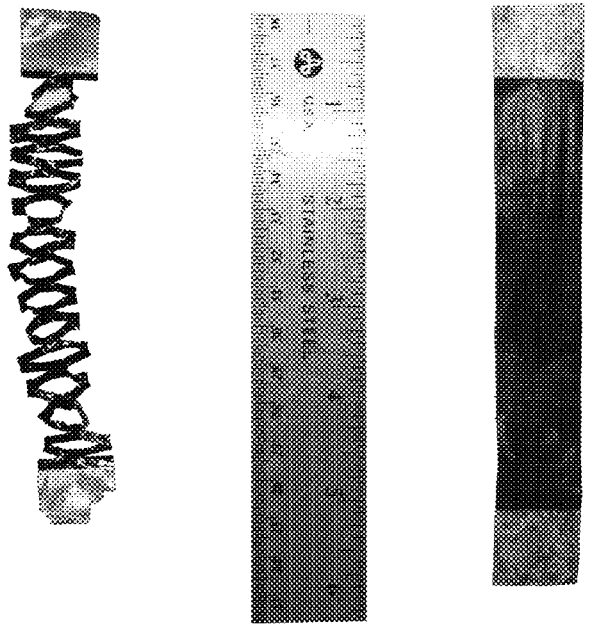

FIG. 10C illustrates a side-by-side comparison between an extensible heater and a heater that is not imparted with the ability to extend.

Figure 10D:
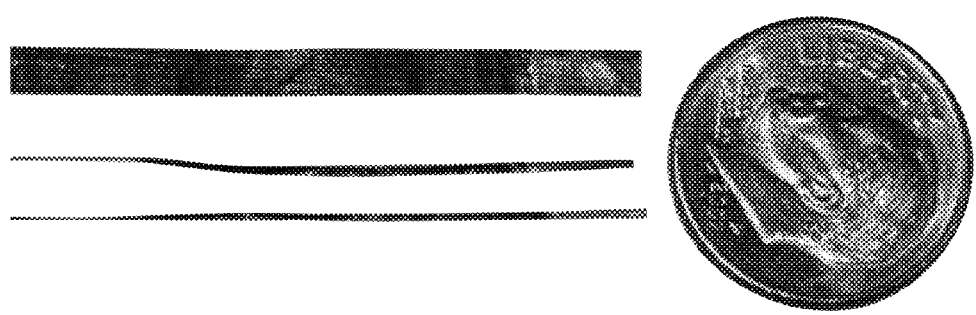

It should be appreciated that although disclosed as a sheet, in an embodiment, heater 20 can also be made from a yarn, ribbon, cable, tape, etc made from a nanostructured-material, such as carbon nanotubes, as illustrated in FIG. 10D.

Doping

A strategy for reducing the resistivity, and therefore increasing the thermal conductivity of the nanotube sheets or yarns of the present invention, includes introducing trace amounts of foreign atoms (i.e. doping) during the nanotube growth process. Such an approach, in an embodiment, can employ any known protocols available in the art, and can be incorporated into the growth process of the present invention.

The thermal conductivity of heater 20 ranges from about 40 Watts/m-° K. to about 120 Watts/m-° K. depending on the properties of the CNT materials and the dopant.

In an alternate embodiment, post-growth doping of a collected nanotube sheet or yarn can also be utilized to reduce the resistivity. Post-growth doping may be achieved by heating a sample of nanotubes in a $N_2$ environment to about 1500° C. for up to about 4 hours. In addition, placing the carbon nanotube material over a crucible of $B_2O_3$ at these temperatures will also allow for boron doping of the material, which can be done concurrently with $N_2$ to create $B_xN_yC_z$ nanotubes.

Examples of foreign elements which have been shown to have an effect in reducing resistivity in individual nanotubes include but are not limited to boron, nitrogen, boron-nitrogen, ozone, potassium and other alkali metals, and bromine.

In one embodiment, potassium-doped nanotubes have about an order of magnitude reduction in resistivity over pristine undoped nanotubes. Boron doping may also alter characteristics of the nanotubes. For example, boron doping can introduce p-type behavior into the inherently n-type nanotube. In particular, boron-mediated growth using $BF_3$/MeOH as the boron source has been observed to have an important effect on the electronic properties of the nanotubes. Other potential sources useful for boron doping of nanotubes include, but are not limited to $B(OCH_3)_3$, $B_2H_6$, and $BCl_3$.

Another source of dopants for use in connection with an embodiment of the present invention is nitrogen. Nitrogen doping may be done by adding melamine, acetonitrile, benzylamine, or dimethylformamide to the catalyst or carbon source. Carrying out carbon nanotube synthesis in a nitrogen atmosphere can also lead to small amounts of N-doping.

It should be appreciated that when doping the yarn or sheet made from nanotubes with a p-type dopant, such as boron, the Seebeck value and other electrical properties may remain p-type in a vacuum. On the other hand, by doping the yarn or sheet with a strong n-type dopant, such as nitrogen, the nanotubes can exhibit a negative Seebeck value, as well as other n-type electrical characteristics even under ambient conditions.

Heater Operation and Applications

Heater 20 can act as a heating mechanism when current is applied to the connector portions 22 in order to heat any devices, structures and components in need of being heated. Heater 20, in any of the embodiments disclosed above, can be used in-situ, that is, it may be embedded within a device. In other words, heater 20 may also be bonded, glued, engaged to, or otherwise integrated, incorporated within the device, or may be embedded within a device during manufacture. Heater 20 may also be bonded, glued, engaged to, or otherwise connected by any means known in the art to an exterior surface or interior surface of a device. Such a device can be of any material capable of being heated, for instance, metal, metal alloy, graphite epoxy, composites etc.

Heater 20 can be highly flexible and can be bent through, for example, extreme radii without breakage or compromise of thermal conductivity. Moreover, heater 20 can be positioned against, upon, or within a flat, curved, concave, convex, or irregularly-shaped surface.

The heater 20 can be of any geometric shape, including square, round, triangular, rectangular, hexagonal, and irregularly-shaped. The heater 20 may also be laser cut to complex shapes and exacting specifications. The wide variety in heater 20 shape allows for the fitting of the heater 20 within a device during manufacture, or to the exterior or interior surfaces of a device.

Wiring to connect the heaters 20 to electrical power supplies may be provided. Power to the heater can be alternating current or direct current. Also within the scope of the present application are voltage control mechanisms to turn the heaters 20 on and off, provide voltage regulation, and over-temperature safety switches. Temperature sensors may be provided to regulate the current flowing to the heaters 20. The regulation of the voltage, current, frequency, temperature and heating may be controlled by a microprocessor, or by non-computerized means. Heater 20 may be connected in series (i.e. serially) and/or in parallel. Heater 20 can tolerate very high power and instant "on," i.e., the heater 20 need not be ramped up by gradually increasing voltage to the heaters, but may bear full voltage from a "cold start."

If the heater 20 is embedded within a device, or otherwise has an epoxy as a constituent, the power to the heater 20 may only be limited by the thermal tolerance of the epoxy. The carbon nanotube-based materials that comprise the heater 20 tend to be corrosion resistant or immune to corrosion.

Many devices, structures, or components may be heated by heater 20, including those in the aeronautical, aerospace, automotive, railway, manufacturing, medical, building, residential, consumer-products, and food-related spheres. Examples of some of these devices, structures or components include but are not limited to those in connection with satellite, satellite housing, other satellite parts or components, fuel lines, rockets, spacecrafts, airplanes, automobiles, batteries, motors, or any other structures or components in need of being heated.

Advantages and unique characteristics of the heater of the present invention include lightweight, fatigue resistant, able to withstand high temperatures (e.g. about 350° C.), impact resistant or essentially immune to impact, and compatible with commonly used epoxies, composite materials, metals, or any materials capable of withstanding heat. In addition, the heater of the present invention can be easily manufactured, can be lightweight, and capable of handling high power.

Heater 20, for instance a CNT heating strip as shown in FIG. 7, will act as a heater when current is applied to the connector portions 22. Heater 20 can be used in-situ, that is, it may be embedded within a structure or a composite material, such as a graphite epoxy material. Heater 20 may also be bonded, glued, engaged to the exterior surface of a structure or a composite material, or to the interior surface of a structure or a composite material.

When the heater 20 or plurality of heaters 20 are embedded, for instance, in a graphite epoxy material or within any structure, wiring to the connector portions can be provided. A bonding agent selected to embed a heater 20, for example, may be a bismaleimide (BMI) resin, a polyimide resin, or a toughened epoxy, or any other commercially available resin. It should be appreciated that the coefficient of thermal expansion (CTE) of the present CNT-based heater 20 can be compatible with numerous epoxies or composite material. As such, the CNT-based heater 20 of the present invention can be suitable for a number of applications described herein. Moreover, a relatively high power heater 20 can be bonded to graphite epoxy material, a composite material or other substrates in such a manner that there is substantially no delamination, and the bonding process can be easily integrated into normal manufacturing processes. It should be noted that type of substrate to which the heater 20 is bonded may influence spacing of between a plurality of heaters 20, based on the thermal conductivity of the substrate.

In an embodiment, a sufficient surface area of heaters 20 or embedded heaters 20 may be provided for heating purposes. In a further embodiment, a sufficient surface area of heaters 20 and/or embedded heaters 20 may be provided for heating surface of various devices, structures or components in need of heating. However, it should be appreciated that the density and placement of heaters 20 and/or embedded heaters 20, whether placed in-situ, externally, or internally on a device, structure or component can allow for rapid heating to effect anti-icing or de-icing.

CNT-based heaters 20 of the present application may have heater geometry based on the following specifications. For example, a heater 20 with a thickness of 100 to 150 μM may generate 1 to 4 Watts or more per square inch of heater 20. An embedded heater 20 of greater thickness may generate 20 Watts per square inch or more. The power supply to the heater 20 or embedded heater 20 can be 440V 3-phase AC power. In further embodiments, the power supply can be DC, and/or of lower voltage.

Due to the design, lightweight and simplicity of the heater of the present invention, if heater 20 or embedded heater 20 were to be damaged, the damaged heater could be replaced by abrasively removing the damaged part and, for instance, epoxy bonding a replacement heater 30 into the existing structure. The repair and replacement may take place on-site or in the field with little fuss.

Heater 20 of the present invention may also be strong, UV resistant, and/or impact resistant, so that it can be placed on the outside of a device, structure or component that may be exposed to inclement weather or various environmental conditions. An advantage of placing an embedded heater 20 on the outside of the a device, structure or component is that heating will be almost immediate.

Heater 20 may also be placed or embedded within a device, structure or component. By doing so, the embedded heater 20 will be substantially protected from objects hitting it. For an embedded heater, holes in the device, structure or component may be required to pass leads or wiring therethrough in order to connect the embedded heater 20 to one or more power supplies. Moreover, it should be noted that while a low thermal conductivity in the Z direction for some material to which the heater 20 is coupled or embedded may require higher embedded heater 20 temperatures, the in-plane conductivity of certain substrate materials can be relatively high, e.g., graphite epoxy, such that heat from the heater 20 will be dissipated within the plane of the substrate material with a low degree of hot spots.

Various implementations and testing procedures for the heater 20 are illustrated in the following examples.

EXAMPLES

Example 1

Heater 20 was manufactured from non-woven carbon nanotube sheets. Rectangular strips and strips with a parabolic profile were tested as heaters. The ends of the strips were electroplated with nickel followed by copper. The electroplating created low resistance contacts for electrical input.

Figure 11:
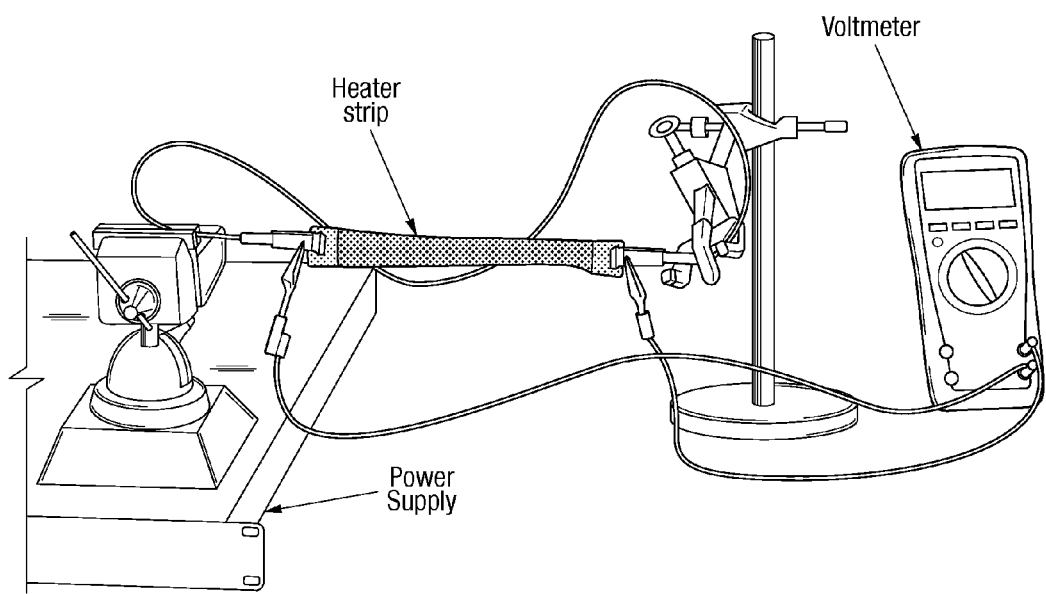
FIG. 11 illustrates an experimental setup for testing heaters.
Figure 12A:
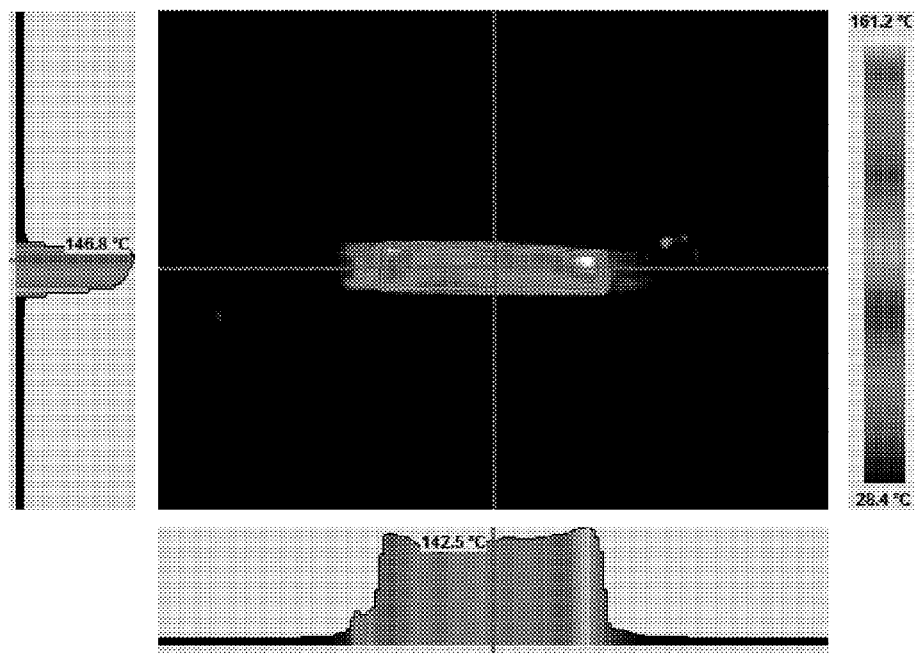
FIGS. 12A-12B illustrate a temperature distribution of two different heaters in accordance with an embodiment of the present invention.
Figure 12B:
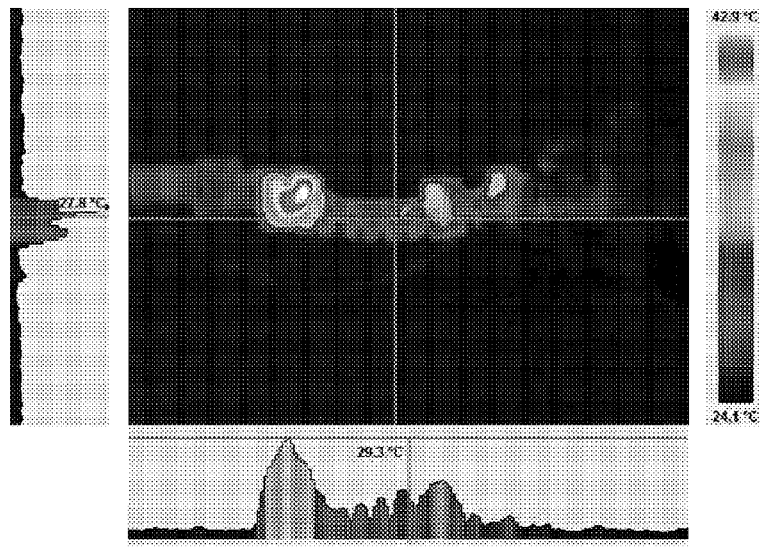

The heater strips were then supported in air and electrified to test their heating properties (see FIG. 11). A high power (40V, 25 A) DC power supply was used to supply the input power. An ammeter was attached in series to measure the current in the circuit. A voltmeter was attached at the power inputs to measure the voltage drop across the strip. The temperature distribution was collected by a Wahl HSI3000 HeatSpy® thermal imaging camera. The strips were then heated at different powers to measure steady state temperatures and temperature uniformity. Since the strips are completely exposed to air, the tubes could oxidize at temperatures above 300° C. Temperatures were therefore limited to 200° C. The temperature distribution of the strips proved to be highly uniform for a non-extensible heater (FIG. 12A) and an extensible heater (12B).

Example 2

Testing of the embedded heaters was very similar to the setup used for the testing of the heater strips in air. The electricity was supplied by a high power (40V, 25 A) DC power supply, current was measured with an ammeter in series, and voltage with a voltmeter attached at the electrical inputs. The temperature was again measured with the Wahl HSI3000 thermal camera. The emissivity of the material was calibrated by using a k-type thermocouple. Temperature profiles were data logged to a PC at a fixed time rate until after steady state had been reached. The composite/heater structure was held vertically in the air by a clamp attached at the bottom.

Electrical contact was made by bolting copper blocks onto the copper of the heater. The bolts went through the entire structure and were made of brass. Ring terminals were attached to the bolt directly in contact with the copper block.

Example 3

Several different techniques were tried to embed the CNT heater strips into the composite structures. Composite structures of CNT heater strip material and the Cyclom 997/Graphite epoxy were made at 180° C. and 50 p.s.i. in a hot press. A single layer of the prepreg was combined with a single layer of the CNT material. Results show thorough penetration of epoxy into the CNT material and good attachment between to the two materials.

Example 4

Figure 13:
FIG. 13 illustrates a temperature distribution of an embedded heater in accordance with a further embodiment of the present invention.

A CNT heater was made and imbedded between layers of a composite material. The embedded heater was cured at 180° C. and 50 p.s.i. in a hot press. FIG. 13 shows a temperature distribution of an embedded heater made from IM7 Fiber composite, with the heater between a 4-ply composite, and receiving an input power of 0.3 W/cm². The four-layer 0°-90° C. IM7 composite was demonstrated to heat from a CNT heat strip located between layers 1 and 2. Thus, an alternate approach to using the prepreg as the bonding material can be to use a graphite composite and insulating layer between the composite and the CNT heat strip.

Example 5

In another approach, the embedded heaters used epoxy and the insulation system to bond and electrically isolate the CNT heater bonded to 8-ply composites. The epoxy used for these experiments was EPON 862 with EPIKURE W as the curing agent mixed at a 100:24 ratio. The epoxy was then diluted 1:1 with acetone to lower viscosity and simplify application. The composites were cured either in a hot press at 50 p.s.i. at 177°

C. for 3 hours or a vacuum bagger at 177° C. for 3 hours. There were no observed differences between the two curing procedures.

When testing the samples for steady state conditions the heaters would be controlled under constant current conditions and would run until the temperature was stable for several minutes. Input power was normalized by heater size. A temperature limit of 250° C. was used for all experiments. Typical power input into the heaters was less than 20 W. However, power inputs of over 100 W were demonstrated. The steady state temperature was exhibited in the middle of the sample on the back at about 83° C. It was also observed that the sample reached 60° C. in less than one minute and 80° C. in approximately 4 minutes. The insulator in this case is paper.

Example 6

To demonstrate the high power capabilities of the CNT heaters, the same heater Example 5 was heated at 112 W. This has a power density of 8.4 W/cm$^2$. The current and voltage inputs were 7.5 A and 14.9V respectively. Even at this high power, no electrical leakage was observed. Under these conditions the middle of the back of the sample reached 100° C. in less than 15 seconds. This temperature reached 225° C. in approximately 80 seconds. The only cooling in this system was natural convection.

It was also observed that resistance was highly linear over the temperature range studied (Room Temperature to 225° C.). The power input was from 0 to 78 W.

Example 7

An electrical isolation system was provided that insulated both the electrical pass-throughs and the CNT strip from the composite. The separator used was electrically resistive enough to prevent shorting, while being highly thermally conductive to allow heat transfer. The use of 0.004" paper and 0.001" polyamide separators as insulators was successfully demonstrated. The first separated samples were tested with clips, to ensure that proper isolation had been achieved. At relatively high currents (e.g., greater than 3 A), minor localized graphite heating could occur at the attachment point. This may be due to the back side of the clip not being insulated from the graphite. Both of the separators were attached to the composite using EPON 862 epoxy, with the CNT strip being attached to the top using the same epoxy. The thermal resistance of both materials separators appears to be negligible when compared to the thermal properties of the graphite.

While the present invention has been described with reference to certain embodiments thereof, it should be understood by those skilled in the art that various changes may be made and equivalents may be substituted without departing from the true spirit and scope of the invention. In addition, many modifications may be made to adapt to a particular situation, indication, material and composition of matter, process step or steps, without departing from the spirit and scope of the present invention. All such modifications are intended to be within the scope of the claims appended hereto.

What is claimed is:

1. A heating device comprising:
   a thermally conducting member having opposing ends and made from a non-woven sheet of carbon nanotubes, the non-woven sheet having a first and a second surface and a plurality of continuous layers situated on top of one another therebetween, the carbon nanotubes of the non-woven sheet being sufficiently intermingled with one another such that an adequate number of contact sites exists to provide the necessary bonding strength between the intermingled nanotubes to form a continuous structure, and being able to support itself structurally independent of the assistance of a substrate or binder;
   a connector portion, positioned at each end of the conducting member, for receiving a current from an external source to permit the conducting member to generate heat; and
   a conductive coupling mechanism, separate from the thermally conductive member, disposed on a surface of the thermally conducting member and sandwiched between the connector portion and the thermally conducting member so as to enhance conductive contact between the thermally conducting member and the connector portion.

2. A heating device as set forth in claim 1, further including a thermally conductive body coupled to the conducting member so as to permit expansion of a heating zone of the conducting member.

3. A heating device as set forth in claim 2, wherein the thermally conductive body is made from one of a metal, a metal alloy, any other thermally conductive material or a combination thereof.

4. A heating device as set forth in claim 1, further including a resin material incorporated and dispersed throughout the conducting member.

5. A heating device as set forth in claim 1, further including an insulating component so as to minimize leakage of current from the device.

6. A heating device as set forth in claim 1, wherein the heating device is designed to be coupled to another device, structure or component to provide heat thereto.

7. A heating device as set forth in claim 1, wherein the heating device is designed to be embedded within a device, structure or component to provide heat thereto.

8. A heating device as set forth in claim 1, wherein the heating device is designed to be coupled to or embedded within a device, structure or component including one of a satellite, satellite housing, other satellite parts or components, fuel lines, rockets, spacecrafts, airplanes, automobiles, batteries, motors, or any other structures or components in need of being heated.

9. A heating device as set forth in claim 8 for use in connection with de-icing of a structure, device or component.

10. A method comprising:
    providing a heater having 1) a thermally conducting member having opposing ends and made from a non-woven sheet of carbon nanotubes, the non-woven sheet having a first and a second surface and a plurality of continuous layers situated on top of one another therebetween, the carbon nanotubes of the non-woven sheet being sufficiently intermingled with one another such that an adequate number of contact sites exists to provide the necessary bonding strength between the intermingled nanotubes to form a continuous structure, and being able to support itself structurally independent of the assistance of a substrate or binder, 2) a connector portion positioned at each end of the conducting member capable of receiving a current from an external source to permit the conducting member to generate heat, and 3) a conductive coupling mechanism, separate from the thermally conductive member, disposed on a surface of the thermally conducting member and sandwiched between the connector portion and the thermally conducting member so as to enhance substantially uniform conductive contact across a contact surface area between the thermally conducting member and the connector portion;

attaching the heater to a device, structure, or component in need of being heated;

directing a current to the heater through the connector portion and the coupling mechanism so the conducting member generates heat; and heating the device, structure, or component to desired levels.

11. The method of claim 10, further comprising expanding the conducting member of the heater to accommodate thermal expansion of the device, structure, or component during heating.

12. The method of claim 10, wherein attaching the heater includes coupling the heater to an interior surface of the device, structure, or component.

13. The method of claim 10, wherein attaching the heater includes coupling the heater to an exterior surface of the device, structure, or component.

14. The method of claim 10, wherein attaching the heater includes embedding the heater into the device, structure, or component.

15. The method of claim 10, wherein directing a current to the heater includes connecting a power source to the connector portion of the heater.

16. The method of claim 10 wherein heating the device, structure, or component includes de-icing the device, structure, or component.

17. The heating device of claim 1, wherein the conducting member, the connecting portion and the coupling mechanism form a unitary structure.

18. A heating device, comprising:
a thermally conducting member having opposing ends and made from a non-woven sheet of carbon nanotubes, the non-woven sheet having a first and a second surface and a plurality of continuous layers situated on top of one another therebetween, the carbon nanotubes of the non-woven sheet being sufficiently intermingled with one another such that an adequate number of contact sites exists to provide the necessary bonding strength between the intermingled nanotubes to form a continuous structure, and being able to support itself structurally independent of the assistance of a substrate or binder a connector portion disposed at each end of the thermally conducting member, the connector portion designed to receive a current from an external source and transmitting the received current to the thermally conducting member so that the thermally conducting member generates heat; and a conductive coupling mechanism, separate from the thermally conductive member, disposed on a surface of the thermally conducting member and sandwiched between the connector portion and the thermally conducting member so as to enhance conductive contact between the thermally conducting member and the connector portion.

19. The heating device of claim 18, further comprising:
a thermally conductive body
wherein the thermally conductive body is coupled to the thermally conducting member and configured so as to accommodate expansion of the thermally conducting member.

20. The heating device of claim 18, wherein the thermally conducting member further comprises a resin material that is incorporated into and dispersed throughout the matrix of carbon nanotubes forming the thermally conducting member.

21. The heating device of claim 18, wherein when the coupling mechanism and the connector portion are disposed on the thermally conducting member, the resultant is a self-supporting unitary structure.

* * * * *